United States Patent [19]

Kerstens

[11] 4,129,834

[45] Dec. 12, 1978

[54] RESONANT CAVITY MAGNETRON WITH CHOKE STRUCTURE FOR REDUCING HARMONICS IN OUTPUT SYSTEM

[75] Inventor: Franciscus N. A. Kerstens, Eindhoven, Netherlands

[73] Assignee: U.S. Philips Corporation, New York, N.Y.

[21] Appl. No.: 851,280

[22] Filed: Nov. 14, 1977

[30] Foreign Application Priority Data

Jan. 17, 1977 [NL] Netherlands ........................ 7700417

[51] Int. Cl.[2] ............................................... H03B 9/10

[52] U.S. Cl. .............................. 331/91; 219/10.55 D; 315/39.53

[58] Field of Search ................. 219/10.55 R, 10.55 A, 219/10.55 D; 331/86, 88, 90, 91; 315/39.77, 39.53, 39.51; 333/76

[56] References Cited

U.S. PATENT DOCUMENTS

| | | | |
|---|---|---|---|
| 3,536,953 | 10/1970 | van de Goor | 331/91 |
| 3,849,737 | 11/1974 | Oguro | 331/86 |
| 4,006,382 | 2/1977 | Butler | 331/91 |

*Primary Examiner*—John Kominski
*Attorney, Agent, or Firm*—Thomas A. Briody; Algy Tamoshunas

[57] ABSTRACT

Disclosed is a magnetron with a folded ¼λ choke for suppression of higher harmonics formed by three coaxial conductors, the inner one of which is connected to the output probe of the magnetron.

4 Claims, 3 Drawing Figures

Figure 2:
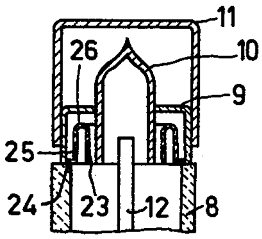

RESONANT CAVITY MAGNETRON WITH CHOKE STRUCTURE FOR REDUCING HARMONICS IN OUTPUT SYSTEM

The invention relates to a resonant cavity magnetron comprising an anode housing having anode vanes extending inwardly from the inner wall of the anode housing, an output portion formed by a hollow ceramic cylinder which is connected at one end to an aperture in the readily conducting tube wall and which is sealed at the other end, an output probe or aerial which extends into the output portion and is connected to at least one of the anode vanes, and a ¼ λ choke for a higher harmonic of the fundamental oscillation of the magnetron provided in the output portion.

Such magnetrons are frequently used in microwave ovens for preparing food and the like. The magnetron is connected to the oven space via a short piece of wave guide or radiates directly into the oven space. In such ovens, the radiation at the fundamental frequency of oscillation through the door connection and optical windows, which may be present in the door, can be reduced by comparatively simple techniques sufficiently to satisfy health hazard requirements and requirements relating to interference radiation for high frequency apparatus. It is however, much more difficult to reduce radiation at the higher harmonics which are generated to a considerable extent in addition to the fundamental oscillation. Not only is the ratio between the length of the edge of the door and the wavelength much more unfavourable, but also the influence of small deviations in size and deformations of the door and the rabbet is much larger at the higher harmonics. Magnetrons for the above mentioned applications have a fundamental oscillation with a frequency of approximately 2450 MHz, so the second harmonic has a frequency of approximately 4900 MHz. This frequency lies near a frequency band for telecommunication involving low powers. Although the powers of the higher harmonics of the magnetron are lower by many factors of 10 than that which might pose a health hazard to the oven user, the higher harmonics can nevertheless produce interference in the telecommunication frequency band. It is therefore necessary to minimize the radiation at the higher harmonics from the magnetron in the oven. These considerations also apply to those magnetrons in which the $\pi - 1$ mode has a considerable frequency deviating from the fundamental oscillation, for example, approximately 4300 with respect to 2450 MHz.

In the construction described in U.S. Pat. No. 3,849,737, the metallic exhaust tube is pinched off simultaneously with the central conductor of the output system incorporated therein. Since the length of the exhaust tube is not sufficient to form a ¼ λ choke for the second harmonic, a metallization of the inner end of the ceramic cylinder adjoins it. Due to the large length of such a construction, the dimensions of the magnetron output portion are not always suitable for use with standard wave guides. In the known magnetron, chokes are also provided for harmonics higher than the second, for example, by a continuation of the ceramic cylinder as an inwardly directed metal pipe. Alternatively, unilaterally closed tubes of a small diameter and length are arranged around the inner conductor.

The invention provides a construction which has smaller axial dimensions.

According to the invention, in a resonant magnetron of the kind described in the preamble, the ¼ λ choke is formed by a first conductor connected to the aerial or probe and a second tubular conductor which is coaxial with and surround the first conductor. The side of the second conductor remote from the anode housing is connected to the first conductor in a manner sealing for electro-magnetic radiation. A third tubular conductor disposed coaxially between the first and the second conductor, on the side facing the anode housing, is connected in a manner sealing for electro-magnetic radiation to the first or the second conductor in such manner that a folded ¼ λ choke is obtained. If desired, the first conductor may be made a part of the probe itself. Since the choke is folded into two axial parts or sections, the required length is smaller than in known construction and a metallization need not be provided on the ceramic cylinder. According to the invention, an axially directed ¼ λ choke for a further higher harmonic may be formed in a simple manner between the two axial choke sections. For example, a first choke for the second harmonic and a second choke for the third or a higher harmonic.

Figure 3:
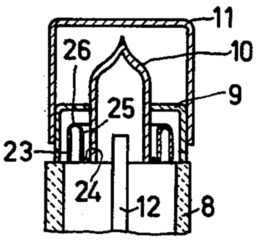
Figure 1:
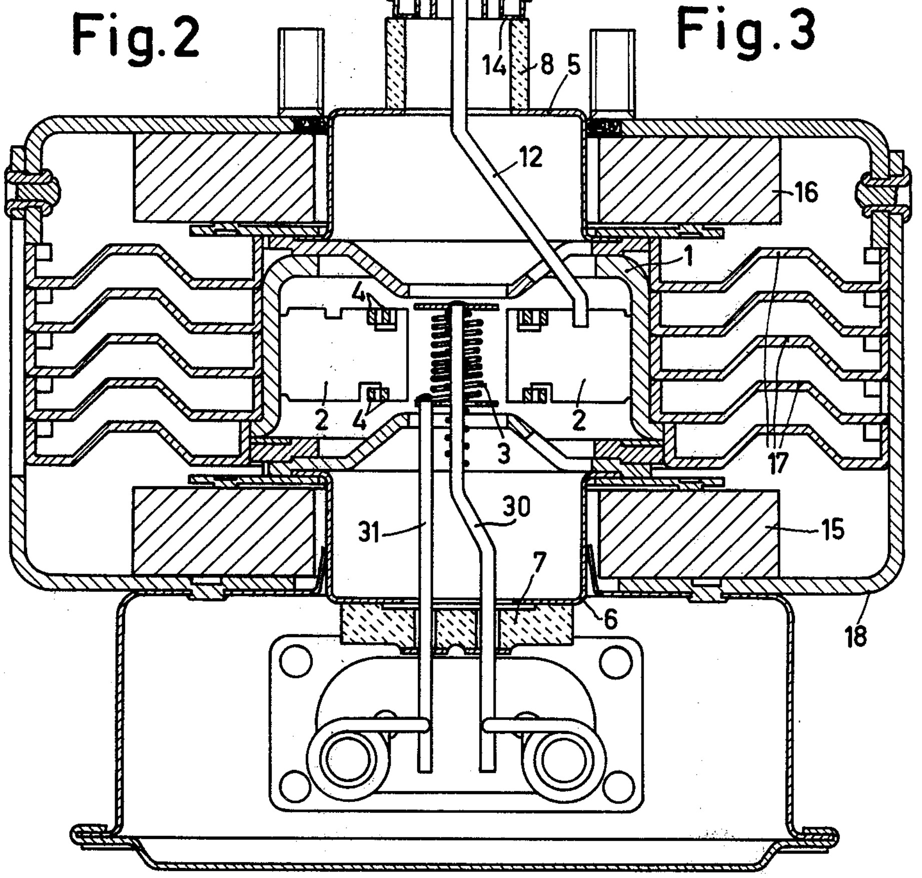

The invention will be described in greater detail with reference to the drawing in which FIG. 1 is an axial sectional view through a magnetron with an output system according to the invention and FIGS. 2 and 3 are modified embodiments of said output system.

Reference numeral 1 in FIG. 1 denotes the copper anode housing of a magnetron having a number of copper anode vanes 2 extending from the inner wall of the anode housing 1 to a helical thoriated tungsten cathode 3. The anode vanes are alternately connected on the upper and lower side near the cathode by readily conducting rings or straps 4. Metal sleeves 5 and 6 form the end spaces. End space 6 is closed by a ceramic plate 7 through which extend the cathode supply conductors 30 and 31. A ceramic window 8 adjoins the open sleeve 5 and supports a metal cap 9 disposed about the exhaust tube 10. A protective cap 11 protects the pinched off end of the exhaust tube 10. A narrow flat probe 12 connects one of the anode vanes 2 to the exhaust tube 10 which is connected to the assembly 9/11. During operation of the magnetron the assembly is inserted in a wave guide or resonant cavity (in this case the oven space). A folded ¼ λ choke for the second harmonic is thus formed by the exhaust tube 10, which serves as as a first conductor, the cylinder wall of the cap 9, which serves as a second conductor and a cylinder 13 disposed between the first and the second conductors which serves as a third conductor. The cylinder 13 has a flange 14 which is connected to the cylinder wall of the cap 9. The flange 14 may also be directed inwardly, in which case it is connected to the exhaust tube. Thus the axial dimension of the ¼ λ choke is only approximately half of that in a construction in which the choke is not folded. The magnetron furthermore includes an axially magnetized permanent magnetic disks 15 and 16, cooling fins 17 and a magnet yoke which is also the cooler housing 18. In FIG. 2 the ¼ λ choke for the second harmonic is formed between a cylinder 23, serving as a fourth conductor, and the exhaust tube 10, which acts as a first conductor and further between a cylinder 25, which acts as a third conductor and the cylinder wall of the cap 9, which acts as a second conductor. The spaces between the cylinders are sealed for electro-magnetic radiation by a flange 24 and a rounded-off end 26. The choke formed between the cylinders 23 and 25 may be for the third or a higher harmonic.

The only difference between FIG. 3 and FIG. 2 is that the input of the choke is situated on the outside diameter instead of on the inside diameter thereof. Such a variation is also possible with reference to FIG. 1.

What is claimed is:

1. A resonant cavity magnetron comprising an anode housing having an aperture in one side thereof and a plurality of anode vanes extending from the inner wall of said housing, an output portion including a probe connected to at least one of said vanes and extending through said aperture beyond said housing and a ¼ λ folded choke for suppression of a higher harmonic of the fundamental frequency of oscillation of the magnetron spaced from said housing, said folded choke including a first generally cylindrical conductor connected to an end portion of said probe extending beyond said housing, a second tubular conductor coaxial with and surrounding said first conductor with a gap therebetween, the end of said second conductor remote from said housing being connected to said first conductor to define a first choke section, and a third tubular conductor coaxial with said first conductor disposed between said first and second conductors, the end of said third conductor adjacent said housing being connected to one of said first and second conductors to define a second choke section, said first and second choke sections forming said folded ¼ λ choke.

2. A magnetron according to claim 1, wherein said end of said third conductor is connected to said first conductor defining said second choke section, and including a fourth tubular conductor coaxial with said first conductor disposed between said second and third conductors, the end of said fourth conductor remote from said housing being connected to said third conductor to define a ¼ λ choke for suppression of a further higher harmonic.

3. A magnetron according to claim 1, wherein said end of said third conductor is connected to said second conductor defining said second choke section, and including a fourth tubular conductor coaxial with said first conductor disposed between said first and third conductors, the end of said fourth conductor remote from said housing being connected to said third conductor to define a ¼ λ choke for suppression of a further higher harmonic.

4. A magnetron according to claim 2, including a hollow cylindrical ceramic window arranged between said housing and said ¼ λ folded choke.

* * * * *